United States Patent
Tanaka

(10) Patent No.: US 8,947,114 B2
(45) Date of Patent: Feb. 3, 2015

(54) INSPECTING METHOD AND PROGRAM FOR OBJECT TO BE INSPECTED

(75) Inventor: Hideaki Tanaka, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 476 days.

(21) Appl. No.: 12/512,448

(22) Filed: Jul. 30, 2009

(65) Prior Publication Data

US 2010/0026328 A1 Feb. 4, 2010

(30) Foreign Application Priority Data

Jul. 31, 2008 (JP) ................................. 2008-198023

(51) Int. Cl.
*G01R 31/20* (2006.01)
*G01R 31/28* (2006.01)

(52) U.S. Cl.
CPC ........ *G01R 31/2894* (2013.01); *G01R 31/2887* (2013.01)
USPC ............ 324/754.01; 324/757.01; 324/757.03; 324/759.01

(58) Field of Classification Search
CPC ....................................................... G01R 3/00
USPC .............. 324/757.01, 757.03, 759.01, 754.01
See application file for complete search history.

(56) References Cited

U.S. PATENT DOCUMENTS

| | | | | |
|---|---|---|---|---|
| 5,726,920 | A * | 3/1998 | Chen et al. ..................... | 702/108 |
| 5,773,987 | A * | 6/1998 | Montoya ..................... | 324/754.2 |
| 6,731,127 | B2 * | 5/2004 | Watts ........................ | 324/757.04 |
| 6,943,573 | B1 * | 9/2005 | Oborny ..................... | 324/754.03 |
| 7,112,979 | B2 * | 9/2006 | Arabi et al. ................ | 324/759.01 |
| 7,148,716 | B2 * | 12/2006 | Schuette et al. ......... | 324/754.03 |
| 7,319,341 | B1 * | 1/2008 | Harms et al. ............. | 324/754.28 |
| 7,453,261 | B1 * | 11/2008 | Mark ........................ | 324/754.03 |
| 7,532,024 | B2 * | 5/2009 | Balog ...................... | 324/762.01 |
| 7,852,094 | B2 * | 12/2010 | Chraft et al. ............. | 324/754.07 |
| 2002/0075030 | A1 * | 6/2002 | Schittenhelm ................ | 324/765 |
| 2007/0236238 | A1 * | 10/2007 | Chiu et al. ..................... | 324/765 |
| 2007/0245190 | A1 * | 10/2007 | Debenham .................... | 714/724 |
| 2008/0007285 | A1 * | 1/2008 | Nakase et al. ................ | 324/765 |
| 2008/0094096 | A1 * | 4/2008 | Kishimoto et al. ........... | 324/765 |
| 2009/0015280 | A1 * | 1/2009 | Natori ........................... | 324/758 |
| 2009/0119048 | A1 * | 5/2009 | Balog ............................ | 702/83 |

FOREIGN PATENT DOCUMENTS

JP 2004-055837 2/2004

* cited by examiner

*Primary Examiner* — Huy Q Phan
*Assistant Examiner* — Giovanni Astacio-Oquendo
(74) *Attorney, Agent, or Firm* — Oblon, Spivak, McClelland, Maier & Neustadt, L.L.P.

(57) ABSTRACT

An inspecting method for an object to be inspected is provided to bring probes of a probe card into electrical contact with a predetermined number of devices of target devices of the object at a time to inspect electrical characteristics of the target devices by moving a mounting table for mounting thereon the object under the control of a control unit. Upon completion of the inspection of the target devices, if inspection errors have occurred in specific devices of the target devices in a regular pattern, the target devices are re-examined, and when the re-examination is carried out, a contact position between the probe card and the object is displaced from a contact position in a previous inspection by a distance of at least one device to inspect electrical characteristics of the number of devices of the target devices at a time.

8 Claims, 4 Drawing Sheets

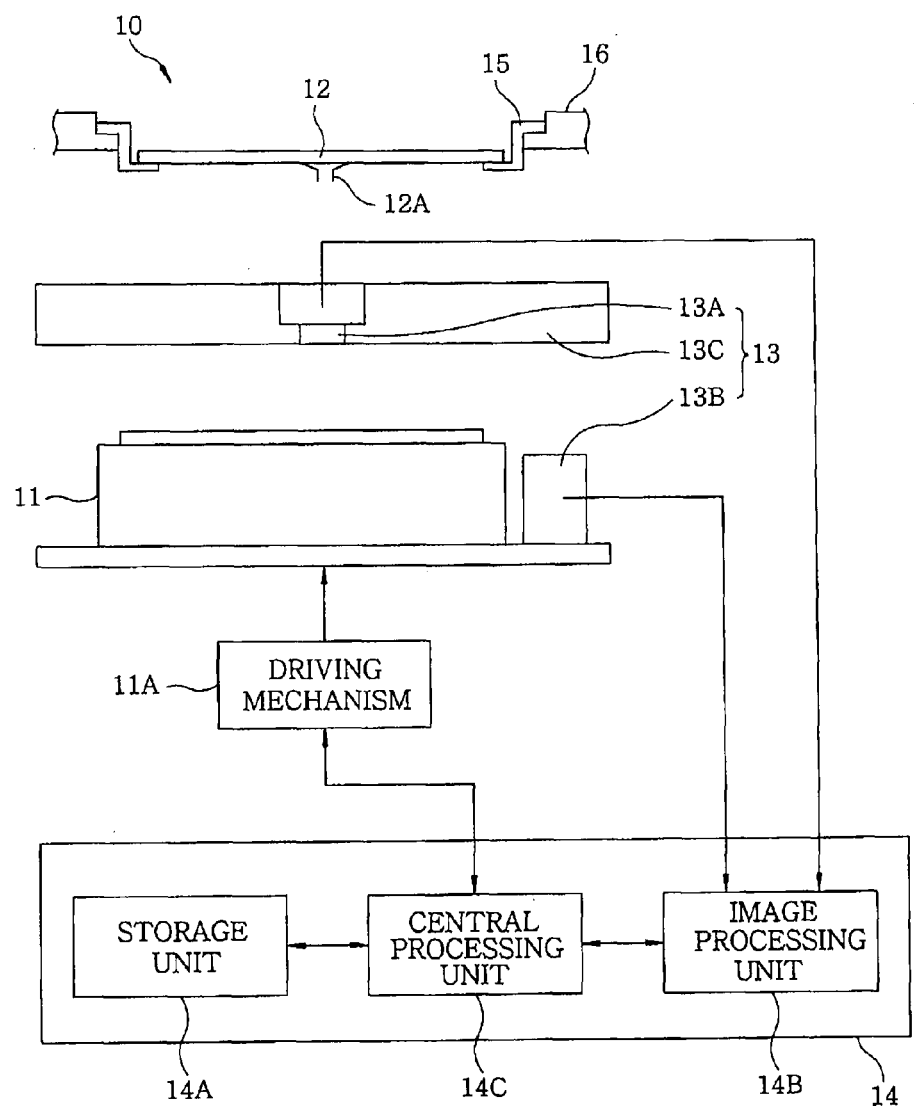

INSPECTING METHOD AND PROGRAM FOR OBJECT TO BE INSPECTED

CROSS-REFERENCE TO RELATED APPLICATIONS

This application claims priority to Japanese Patent Application No. 2008-198023, filed on Jul. 31, 2008, the entire contents of which are hereby incorporated by reference.

FIELD OF THE INVENTION

The present invention relates to an inspecting method for an object to be inspected which inspects electrical characteristics of a plurality of devices simultaneously.

BACKGROUND OF THE INVENTION

A conventional probe apparatus includes a loader chamber 1 and a prober chamber 2 which are arranged adjacent to each other as shown in, e.g., FIG. 3. The loader chamber 1 includes a cassette receiving part 30 for receiving a cassette 20 containing a plurality of semiconductor wafers W therein, a wafer transfer mechanism (not shown) for loading and unloading the wafers W into and from the cassette one by one, and a pre-alignment mechanism (not shown) for pre-aligning a wafer W while transferring the wafer W by the wafer transfer mechanism. The prober chamber 2 has a mounting table 3 which is movable in X, Y, Z and θ directions while mounting thereon a wafer W, a probe card 4 having probes 4A to be brought into electrical contact with electrode pads of some devices among all devices in the wafer W mounted on the mounting table 3, a fixing mechanism 5 for fixing the probe card 4 by using a card holder (not shown), and a connection ring 6 for electrically connecting the probe card 4 and a test head T.

The electrical characteristics of the devices are inspected by bringing the devices into electrical contact with a tester (not shown) via the probe card 4, the connection ring 6 and the test head T under the control of a control unit.

Further, in FIG. 3, reference numeral '7' indicates an alignment mechanism for position-alignment of the wafer W and the probe card 4 in cooperation with the mounting table 3; reference numeral '7A' and '7B' represent an upper camera and a lower camera; and reference numeral '8' indicates a head plate to which the fixing mechanism 5 of the probe card 4 is attached.

Further, as illustrated in FIG. 4 for example, in the case of using the probe card 4 which simultaneously inspects two devices arranged in the X direction with a single contact, the probe card 4 is brought into electrical contact with two devices at a first contact position P1 so that the inspection of first two devices D is performed and the mounting table 3 is moved to the left side of the X direction to perform the inspection of next two devices D. Accordingly, the mounting table 3 is index-fed by a distance of two devices D in the X direction as indicated by the arrow shown in FIG. 4 until the inspection of last two devices D in a first row is completed at a contact position P2.

Afterwards, the mounting table 3 is index-fed upward in the Y direction by a distance of a single device D and is moved to a position to perform the inspection of first two devices D in a second row, and then, the mounting table 3 is index-fed by a distance of two devices D in the X direction opposite to the direction in the first row until the inspection of devices D in the second row is completed.

In the same manner, the inspection is repeatedly performed on devices D of each row until electrical characteristics of all devices subjected to be inspected of the wafer W are inspected, thereby detecting, if any, a defective device D. After the inspection of one wafer W is completed, the inspected wafer W is replaced with a next wafer W and, then, an inspection of electrical characteristics of the new wafer W is performed in the same manner described above.

FIG. 4 shows how the wafer W is being inspected. A reference numeral '4A' in FIG. 4 indicates devices which are being inspected. Besides, a solid line drawn inside the wafer W represents devices D subjected to be inspected.

If a percentage of defective devices D exceeds an allowable range as a result of the first inspection, the same inspection is repeated again on the wafer W in order to confirm the percentage of defective devices D. When the percentage of defective devices D is within the allowable range in the second inspection, the inspected wafer is replaced with a new wafer W, and the new wafer W is inspected.

However, in the first inspection, as indicated by shading shown in FIG. 4, inspection errors occur in specific devices in a regular pattern. In that case, even if the second inspection is performed in the same sequence as that of the first inspection, the same result may be obtained, and the number of defective devices D (the shaded devices shown in FIG. 4) is not reduced. If such devices are determined as defective products, the production yield deteriorates. Further, additional time is required for such re-examination, so that an operation efficiency of the tester is reduced.

SUMMARY OF THE INVENTION

In view of the above, the present invention provides a method of inspecting an object, wherein when inspection errors occur in specific devices in a regular pattern in the first inspection, it is possible to check whether the inspection errors are caused by detective devices in the second inspection, and improve a production yield and an operation efficiency of the tester by effectively utilizing the second inspection, and a program for the inspecting method.

The present inventors have experienced various experiments to discover the cause of the inspection errors shown in FIG. 4. As a result, the present inventors have found that the inspection errors occurring in a regular pattern in the first inspection are caused by a problem of a probe card or that of a channel of a tester.

In accordance with a first aspect of the present invention, there is provided an inspecting method for an object to be inspected, in which probes of a probe card are brought into electrical contact with a predetermined number of devices of target devices of the object at a time to inspect electrical characteristics of the target devices by moving a mounting table for mounting thereon the object under the control of a control unit, wherein, upon completion of the inspection of the target devices, if inspection errors have occurred in specific devices of the target devices in a regular pattern, the target devices are re-examined, and when the re-examination is carried out, a contact position between the probe card and the object is displaced from a contact position in a previous inspection by a distance of at least one device to inspect electrical characteristics of the number of devices of the target devices at a time.

In accordance with a second aspect of the present invention, there is provided an inspecting method for an object to be inspected, in which probes of a probe card are brought into electrical contact with a predetermined number of devices of target devices of the object at a time to inspect electrical characteristics of the target devices by moving a mounting table for mounting thereon the object under the control of a control unit, the method including: inspecting electrical characteristics of the number of devices of the target devices at a time by bringing the object and the probe card into electrical contact with each other by moving the object together with the mounting table by a distance of the number of devices; detecting, upon completion of the inspection of the target devices, whether inspection errors have occurred in specific devices of the target devices in a regular pattern; and performing re-examination when the inspection errors have occurred in the regular pattern.

Further, said performing re-examination includes: displacing an initial contact position where the object and the probe card are newly in contact with each other from an contact position in a previous inspection by a distance of at least one device; and inspecting electrical characteristics of the number of devices of the target devices at a time from the initial contact position in a present inspection.

In accordance with a third aspect of the present invention, there is provided an inspecting program for driving a computer to perform an inspection method for an object to be inspected, in which probes of a probe card are brought into electrical contact with a predetermined number of devices of target devices of the object at a time to inspect electrical characteristics of the target devices by moving a mounting table for mounting thereon the object under the control of a control unit, wherein, upon completion of the inspection of the target devices, if inspection errors have occurred in specific devices of the target devices in a regular pattern, the target devices are re-examined, and when the re-examination is carried out, a contact position between the probe card and the object is displaced from a contact position in a previous inspection by a distance of at least one device to inspect electrical characteristics of the number of devices of the target devices at a time.

In accordance with a fourth aspect of the present invention, there is provided an inspecting program for driving a computer to perform an inspection method for an object to be inspected, in which probes of a probe card are brought into electrical contact with a predetermined number of devices of target devices of the object at a time to inspect electrical characteristics of the target devices by moving a mounting table for mounting thereon the object, wherein the program is executed to perform processes of: inspecting electrical characteristics of the number of devices of the target devices at a time by bringing the object and the probe card into electrical contact with each other by moving the object together with the mounting table by a distance of the number of devices; detecting, upon completion of the inspection of the target devices, whether inspection errors have occurred in specific devices of the target devices in a regular pattern; and performing re-examination when the inspection errors have occurred in the regular pattern.

Further, the process of performing re-examination includes: displacing an initial contact position where the object and the probe card are newly in contact with each other from an contact position in a previous inspection by a distance of at least one device; and inspecting electrical characteristics of the number of devices of the target devices at a time from the initial contact position in a present inspection.

In accordance with the present invention, it is possible to provide an inspecting method and program for an object to be inspected, wherein when inspection errors occur in specific devices in a regular pattern in the first inspection, it is possible to check whether the inspection errors are caused by detective devices in the second inspection, and improve a production yield and an operation efficiency of the tester by effectively utilizing the second inspection.

BRIEF DESCRIPTION OF THE DRAWINGS

The objects and features of the present invention will become apparent from the following description of embodiments, given in conjunction with the accompanying drawings, in which:

FIG. 1 shows an example of an inspection apparatus used for performing an inspecting method for an object to be inspected in accordance with the present invention;

FIGS. 2A and 2B provide top views of a wafer which illustrate a distribution state of detective devices detected by the inspecting method using the inspection apparatus shown in FIG. 1, wherein FIG. 2A depicts a first inspection, and FIG. 2B describes a second inspection;

DETAILED DESCRIPTION OF THE EMBODIMENT

Figure 2A:
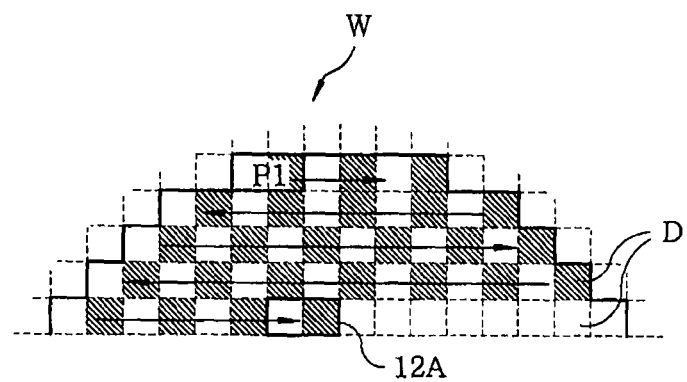

Embodiments of the present invention will be described with reference to FIGS. 1 to 2B which form a part hereof.

First of all, an inspection apparatus (probe apparatus) for performing an inspecting method for an object to be inspected in accordance with an embodiment of the present invention will be described. As shown in, e.g., FIG. 1, the probe apparatus 10 includes a mounting table 11 capable of moving in X, Y, Z and θ directions in a prober chamber, a probe card 12 provided above the mounting table 11, and an alignment mechanism 13 for performing position-alignment between the probe card 12 and the wafer W on the mounting table 11. An inspection of electrical characteristics of each device of the wafer W is performed by index-feeding the wafer W by moving the mounting table 11 after alignment mechanism 13 is driven under the control of the control unit 14 to align electrode pads of devices of the wafer W with probes 12A of the probe card 12 in cooperation with the mounting table 11.

As shown in FIG. 1, the mounting table 11 includes a driving mechanism 11A having an X-direction driving mechanism, a Y-direction driving mechanism and a Z-direction driving mechanism. Therefore, the mounting table 11 can be moved in X, Y, Z and θ directions through the driving mechanism 11A under the control of a control unit 14.

Further, as shown in FIG. 1, the probe card 12 has probes 12A, and is fixed to a head plate 16 by using a card holder 15. The probes 12A are brought in contact with at least two devices D among a plurality of devices D (see FIGS. 2A and 2B) formed on the wafer W. Arrangement of devices D to be simultaneously brought into contact with the probes 12A varies depending on types of the devices D. The devices may be vertically and horizontally arranged in a matrix shape, or at least two devices may be arranged horizontally or vertically. In the present embodiment, the probes 12A are configured to be in contact with two devices D arranged horizontally, as can be seen from FIGS. 2A and 2B.

As shown in FIG. 1, the alignment mechanism 13 includes a first camera 13A moving between the mounting table 11 and the probe card 12, a second camera 13B installed at the side of the mounting table 11, and an alignment bridge 13C to which the first camera 13A is fixed. The first camera 13A moves between an inner side of the prober chamber and a probe center (located on an extension line of the center of the probe card) through the alignment bridge 13C and captures an image of the wafer W on the mounting table 11 at the probe center while the mounting table 11 is moving in X and Y directions. The second camera 13B moves to a position directly below the probes 12A of the probe card 12 by moving the mounting table 11 in X and Y directions, and captures images of the probes 12A at that position.

The control unit 14 mainly includes a computer having a storage unit 14A which stores therein an inspecting program in accordance with the present invention or another program and further stores therein various data for inspection, an image processing unit 14B which processes the images based on image signals from the first and the second cameras 13A and 13B, and a central processing unit 14C which transmits/receives various data to/from the storage unit 14A and the image processing unit 14B to execute operation processing. The inspecting program or the like is read from the storage unit 14A so that various parts of the probe apparatus 10 such as the mounting table 11, the alignment mechanism 13 and the like are controlled by the central processing unit 14C, or various data such as image data and/or numeric data as results of an inspection are processed by the central processing unit 14C depending on the purpose.

Hereinafter, there will be described an inspecting method using an embodiment of an inspecting program for an object to be inspected in accordance with the present invention.

When the computer of the control unit 14 is driven by the inspecting program of the present embodiment, the central processing unit 14C executes the inspecting method of the present embodiment by reading the inspecting program stored in the storage unit 14A. When the inspecting method of the present embodiment is carried out, the mounting table 11 on which the wafer W from the loader chamber is mounted moves in X and Y directions and also rotates in θ direction within a predetermined angle range through the driving mechanism 11A, so that the scribe lines of the wafer W coincide with the X and Y directions.

At the same time, the tip positions of the probes 12A are detected by the second camera 13B of the alignment mechanism 13, and the positions of the electrode pads of the wafer W which correspond to the probes 12A are detected by the first camera 13A. As a consequence, the alignment between the wafer W and the probe card 12 is performed and, then, the inspection of the wafer W is carried out.

After the alignment operation, the mounting table 11 is moved so that devices D to be inspected are positioned directly below the probe card 12. Then, the wafer W is raised from that position, so that a plurality of electrode pads of first two devices D are brought into contact with a plurality of probes 12A corresponding thereto. Next, by overdriving the mounting table 11, electrode pads are allowed to be in electrical contact with the probes, thereby inspecting electrical characteristics of the two devices D. Thereafter, as illustrated in the conventional case, the mounting table 11 is moved to index-feed the wafer W leftward in the X direction by a distance of two devices D. Whenever a row of devices is changed, the wafer W is index-fed upward in the Y direction by a distance of a single device. In this manner, electrical characteristics of all devices subjected to be inspected are inspected two by two while changing the index-feeding direction as shown in FIG. 2A.

After the inspection of all devices D subjected to be inspected of the wafer W is completed, if a percentage of defective devices is within an allowable range, the inspected wafer is replaced with a new wafer W. The new wafer W is inspected in the same manner described above.

On the other hand, as a result of the inspection of all devices D subjected to be inspected of the wafer W, if it is detected in the central processing unit 14C that a percentage of defective devices exceeds the allowable range and also that the distribution of the defective devices D shows that inspection errors occur in a regular pattern in specific devices (for example, the second devices of every two devices brought into contact with the probes 12A as indicated by shading in FIG. 2A). In such cases, the wafer W needs to be re-examined.

Further, there may be a case that is unclear whether the inspection errors are caused by the defect in the devices D or by the defect in the probe card 12 or the channel of the tester. In this case, the inspecting program of the present embodiment can be executed to perform the re-examination in the following manner. In FIG. 2A, arbitrary area of first two devices D brought into contact with the probes 12A of the probe card 12 is indicated as a contact area P1 surrounded by a dashed line.

Figure 2B:
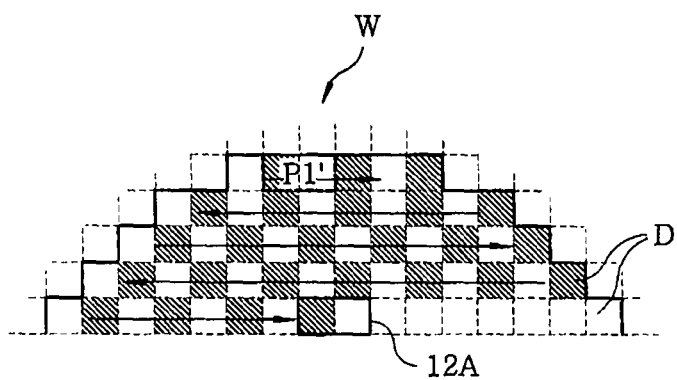
Figure 3:
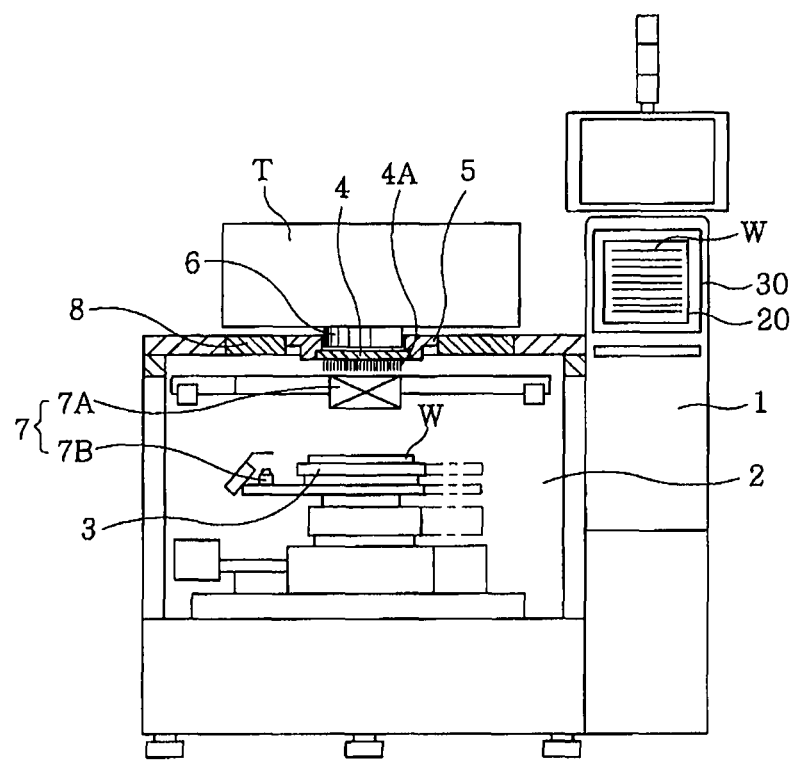
FIG. 3 presents a partially cutaway front view of an example of a conventional probe apparatus.
Figure 4:
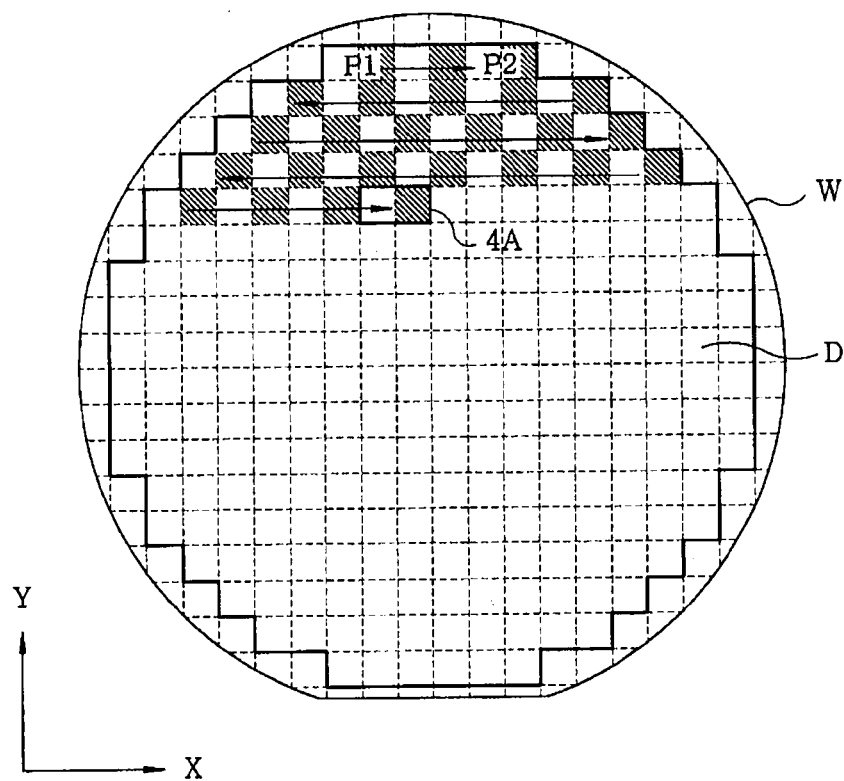
FIG. 4 offers a top view showing a relationship between a wafer and probes of a probe card in the case of using a conventional inspecting method using the inspection apparatus shown in FIG. 3.

When the re-examination is carried out, as shown in FIG. 2B, a first contact position between the probe card 12 and the wafer W is displaced from the first contact area P1 (see FIG. 2A) of the previous inspection to the right in the X direction by a distance of a single device, and then an inspection of electrical characteristics of two devices D is performed in a contact area P1'. Accordingly, defective devices D in the previous inspection are inspected with the probes 12A that were contacted with non-defective devices D in the previous inspection (hereinafter, referred to as "first probes"). That is, in the present inspection, the inspection of the defective devices D in the previous inspection is performed by the first probes of the probes 12A, and the inspection of the non-defective devices D in the previous inspection is performed by second probes of the probes 12A that were contacted with defective devices D in the first inspection.

In the present inspection, if the devices D being inspected with the first probes are detected as non-defective, then such devices D are determined as normal devices D having no defect. Also, in such a case, the devices D being inspected with the second probes in the present inspection are determined as defective even if they are normal devices D.

Meanwhile, if the devices inspected with the first probes are detected as defective in the present inspection, such devices D are detected as defective products.

Therefore, in the present inspection, it is possible to detect whether or not the devices D have defection by inspecting the defective devices D in the previous inspection with the first probes that were contacted with the normal devices D in the first inspection.

Moreover, as a result of the inspection using the first probes, if the devices D are determined as normal, such devices D can be classified as normal products. On the contrary, if such devices D are determined as defective, they can be classified as defective products.

Accordingly, the devices D determined as defective products in the first inspection can be determined as normal products through the second inspection, thus improving a production yield of the product. Besides, the second inspection can be utilized effectively, so that the operation efficiency of the tester can be improved.

As described above, in accordance with the present embodiment, under the control of the control unit 14, the mounting table 11 for mounting thereon the wafer W is moved to bring the probes 12A of the probe card 12 into electrical contact with every two devices D among all devices subjected to be inspected of the wafer, thereby inspecting electrical characteristics of all devices D two by two.

In the above-described inspection, the following steps are carried out, the steps include: a first step of inspecting electrical characteristics of every two devices D by bringing the wafer W and the probe card 12 into electrical contact with each other by moving the wafer W together with the mounting table 11 by a distance of two devices; a second step of detecting in the central processing unit 14C, upon completion of the inspection of all devices D, whether or not the inspection errors have occurred in specific devices among devices D in a regular pattern while the devices D are bringing into contact with probes 12A; and a third step of performing re-examination when the inspection errors have occurred in the regular pattern.

Herein, the third step includes a step of displacing the initial contact area P1' where the wafer W and the probe card 12 are newly brought into contact with each other by a distance of a single device from the initial contact area P1 in the previous inspection and a step of inspecting electrical characteristics of all devices D subjected to be inspected by performing the inspection of two devices D at a time from the initial contact area P1' in the present inspection.

Therefore, when the inspection errors have occurred in specific devices D in a regular pattern in the first inspection, the second inspection is carried out. In the second inspection, the devices D detected as defective products in the first inspection are inspected by the first probes that detected normal devices D in the first inspection. Accordingly, it is possible to detect whether or not the inspection errors in the first inspection are caused by the devices D, and also possible to improve the production yield by reducing a percentage of defective devices D through the second inspection. In addition, the operation efficiency of the tester can be improved by utilizing the second inspection effectively.

Although the case where two devices D are inspected at a time is described in the above embodiment, the present invention can also be applied to a case where three or more devices are inspected at a time. Further, in the above embodiment, the wafer W is displaced in the opposite direction to the inspection direction by a distance of a single device to perform the second inspection upon completion of the first inspection. However, for the second inspection, the wafer W may be displaced in the inspection direction by a distance of a single device. In addition, if the inspection errors occur in two consecutive devices adjacent to each other when three or more devices are inspected simultaneously, the second inspection can be performed by displacing the wafer W by a distance of two devices.

The present invention can be preferably used for inspecting electrical characteristics of an object to be inspected such as a wafer or the like.

While the invention has been shown and described with respect to the embodiments, it will be understood by those skilled in the art that various changes and modification may be made without departing from the scope of the invention as defined in the following claims.

What is claimed is:

1. An inspecting method for use with an inspection apparatus for inspecting an object, in which probes of a probe card are brought into electrical contact with a predetermined number of devices of target devices of the object at a time to inspect electrical characteristics of the target devices by moving a mounting table for mounting thereon the object, comprising:

performing a second inspection of the target devices upon completion of a first inspection of the target devices, if inspection errors have occurred in specific devices of the target devices in a regular pattern indicative of a defect pattern associated with a first set of probes of the probe card;

wherein the specific devices showing said inspection errors in the first inspection are re-inspected during the second inspection with a second set of probes of the probe card that had previously contacted devices other than the specific devices having said inspection errors in the first inspection; and wherein performing a second inspection further comprises moving a mounting table in an opposite direction to an inspection direction or an inspection direction by a predetermined number of devices.

2. The inspecting method of claim 1, wherein the inspecting method is performed under a control of a control unit of the inspection apparatus.

3. A non-transitory computer readable storage medium including computer executable instructions, wherein the instructions, when executed by a processor, cause the processor to perform the inspecting method of claim 1.

4. An inspecting method for use with an inspection apparatus for inspecting an object, in which probes of a probe card are brought into electrical contact with a predetermined number of devices of target devices of the object at a time to inspect electrical characteristics of the target devices by moving a mounting table for mounting thereon the object, the method comprising:

inspecting electrical characteristics of the number of devices of the target devices at a time by bringing the object and the probe card into electrical contact with each other by moving the object together with the mounting table by a distance of the number of devices;

detecting, upon completion of a first inspection of the target devices, whether inspection errors have occurred in specific devices of the target devices in a regular pattern indicative of a defect pattern associated with a first set of probes of the probe card;

performing a second inspection when the inspection errors have occurred in the regular pattern;

wherein the specific devices showing said inspection errors in the first inspection are re-inspected during the second inspection with a second set of probes of the probe card that had previously contacted devices other than the specific devices having said inspection errors in the first inspection; and wherein performing a second inspection further comprises moving a mounting table in an opposite direction to an inspection direction or an inspection direction by a predetermined number of devices.

5. The inspecting method of claim 4, wherein the inspecting method is performed under a control of a control unit of the inspection apparatus.

6. A non-transitory computer readable storage medium including computer executable instructions, wherein the instructions, when executed by a processor, cause the processor to perform the inspecting method of claim 4.

7. An inspecting program stored in a non-transitory computer-readable storage medium and executed for performing an inspection method for an object to be inspected in which probes of a probe card are brought into electrical contact with a predetermined number of devices of target devices of the object at a time to inspect electrical characteristics of the target devices by moving a mounting table for mounting thereon the object under the control of a control unit, comprising:

performing a second inspection of the target devices upon completion of a first inspection of the target devices, if inspection errors have occurred in specific devices of the target devices in a regular pattern indicative of a defect pattern associated with a first set of probes of the probe card;

wherein the specific devices showing said inspection errors in the first inspection are re-inspected during the second inspection with a second set of probes of the probe card that had previously contacted devices other than the specific devices having said inspection errors in the first inspection; and wherein performing a second inspection further comprises moving a mounting table in an opposite direction to an inspection direction or an inspection direction by a pre-determined number of devices.

8. An inspecting program stored in a non-transitory computer-readable storage medium and executed for performing an inspection method for an object to be inspected in which probes of a probe card are brought into electrical contact with a predetermined number of devices of target devices of the object at a time to inspect electrical characteristics of the target devices by moving a mounting table for mounting thereon the object, wherein the program is executed to perform processes of:

inspecting electrical characteristics of the number of devices of the target devices at a time by bringing the object and the probe card into electrical contact with each other by moving the object together with the mounting table by a distance of the number of devices;

detecting, upon completion of a first inspection of the target devices, whether inspection errors have occurred in specific devices of the target devices in a regular pattern indicative of a defect pattern associated with a first set of probes of the probe card;

performing a second inspection when the inspection errors have occurred in the regular pattern;

wherein the specific devices showing said inspection errors in the first inspection are re-inspected during the second inspection with a second set of probes of the probe card that had previously contacted devices other than the specific devices having said inspection errors in the first inspection; and wherein performing a second inspection further comprises moving a mounting table in an opposite direction to an inspection direction or an inspection direction by a pre-determined number of devices.

\* \* \* \* \*